(12) United States Patent
Tsou et al.

(10) Patent No.: US 8,774,744 B2
(45) Date of Patent: Jul. 8, 2014

(54) RADIO FREQUENCY FRONT-END CIRCUIT AND OPERATION METHOD THEREOF

(75) Inventors: Yu-Lin Tsou, Pingtung County (TW); Nai-Chen Cheng, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 13/584,828

(22) Filed: Aug. 14, 2012

(65) Prior Publication Data
US 2013/0278341 A1 Oct. 24, 2013

(30) Foreign Application Priority Data
Apr. 19, 2012 (TW) .............................. 101113993 A

(51) Int. Cl.
*H04B 17/00* (2006.01)
*H04B 1/06* (2006.01)

(52) U.S. Cl.
USPC .................... 455/226.1; 455/232.1; 375/345; 330/271; 330/278

(58) Field of Classification Search
CPC ..... H03G 3/20; H03F 3/211; H03F 2200/294; H04B 1/71637
USPC .......... 455/63.11, 226.1, 226.2, 232.1, 234.1, 455/234.2, 235.1, 245.1, 253.2, 343.1, 574; 375/345; 330/271, 278
See application file for complete search history.

(56) References Cited

U.S. PATENT DOCUMENTS

| | | | |
|---|---|---|---|
| 4,619,002 A * | 10/1986 | Thro | 455/226.2 |
| 6,721,547 B2 * | 4/2004 | Husted et al. | 455/226.1 |
| 6,782,062 B1 * | 8/2004 | Wieck | 375/345 |
| 6,836,647 B2 * | 12/2004 | Rimini et al. | 455/226.2 |
| 6,850,753 B2 | 2/2005 | Zhang et al. | |
| 6,892,062 B2 | 5/2005 | Lee et al. | |
| 7,085,587 B2 * | 8/2006 | Oono et al. | 455/553.1 |
| 7,254,380 B2 | 8/2007 | Kuei-Ann et al. | |
| 7,627,060 B2 * | 12/2009 | Taylor | 375/345 |
| 7,738,566 B2 | 6/2010 | Berckmans et al. | |
| 8,223,900 B2 * | 7/2012 | Zocher et al. | 375/345 |
| 2002/0084853 A1 | 7/2002 | Finlay et al. | |
| 2007/0290754 A1 | 12/2007 | Lee et al. | |
| 2008/0119154 A1 | 5/2008 | Nam et al. | |

OTHER PUBLICATIONS

Pletcher et al., "A 65 µW, 1.9 GHz RF to Digital Baseband Wakeup Receiver for Wireless Sensor Nodes," 2007 IEEE Custom Integrated Circuits Conference (CICC), Sep. 2007, pp. 539-542.

(Continued)

*Primary Examiner* — Quochien B Vuong
(74) *Attorney, Agent, or Firm* — Jianq Chyun IP Office

(57) ABSTRACT

A radio frequency (RF) front-end circuit and an operating method thereof are provided. The proposed RF front-end circuit includes a first linear amplifier, a second linear amplifier, and a calibration unit. The first linear amplifier performs a high-frequency amplification on a RF signal to generate an amplified RF signal, and down-converts the amplified RF signal into an intermediate frequency (IF) signal. The second first linear amplifier performs a low-frequency amplification on the IF signal to generate an amplified IF signal. The calibration unit is coupled to the first and the second linear amplifiers, and receives a voltage gain fed back from the second linear amplifier. Then, the calibration unit performs an auto-calibration procedure according to the voltage gain fed back from the second linear amplifier to search for an input current value of the first linear amplifier, which correspondingly maximizes the voltage gain of the first amplifier.

21 Claims, 6 Drawing Sheets

(56) References Cited

OTHER PUBLICATIONS

Pletcher et al., "A 2GHz 52 µW Wake-Up Receiver with -72dBm Sensitivity Using Uncertain-IF Architecture," 2008 IEEE International Solid-State Circuits Conference (ISSCC), Feb. 2008, pp. 524-633.

Bae et al., "A Low Energy Injection-Locked FSK Transceiver With Frequency-to-Amplitude Conversion for Body Sensor Applications," IEEE Journal of Solid-State Circuits 46(4), Apr. 2011, pp. 928-937.

Drago et al., "A 2.4GHz 830pJ/bit Duty-Cycled Wake-Up Receiver with -82dBm Sensitivity for Crystal-Less Wireless Sensor Nodes,"2010 IEEE International Solid-State Circuits Conference (ISSCC), Feb. 2010, pp. 224-225.

Bohorquez et al., A 350 γW CMOS MSK Transmitter and 400 µW OOK Super-Regenerative Receiver for Medical Implant Communications IEEE Journal of Solid-State Circuits 44(4), Apr. 2009, pp. 1248-1259.

\* cited by examiner

RADIO FREQUENCY FRONT-END CIRCUIT AND OPERATION METHOD THEREOF

CROSS-REFERENCE TO RELATED APPLICATION

This application claims the priority benefit of Taiwan application serial no. 101113993, filed on Apr. 19, 2012. The entirety of the above-mentioned patent application is hereby incorporated by reference herein and made a part of this specification.

TECHNICAL FIELD

The disclosure relates to a radio frequency front-end circuit and an operation method thereof.

BACKGROUND

Currently, receiving terminal devices adopting the On-Off Keying (OOK) modulation system may use two types of demodulation circuit topologies. The first type of OOK demodulation circuit topology may be, for example, a Direct Radio Frequency (DRF) demodulation circuit. The DRF demodulation circuit amplifies a received radio frequency (RF) signal through a first stage amplifier (i.e., a linear amplifier) circuit, and then performs an envelop detection on the received RF signal (which had been amplified by the first stage amplifier circuit) through a second stage amplifier (i.e., a nonlinear amplifier) to obtain the data in the received RF signal. The OOK demodulation circuit topology may encounter a situation that when power consumption of the overall receiver needs to be lowered, the gain of the first stage amplifier circuit is simultaneously lowered, which results in an overall system sensitivity being lowered.

The second type of the OOK demodulation circuit topology may be, for example, an Uncertain Intermediate Frequency (UIF) demodulation circuit. The UIF demodulation circuit separates the first stage amplifier (i.e., a linear amplifier) circuit of the previous DRF demodulation circuit into two amplification stages. A first amplification stage performs a high-frequency amplification on the received RF signal, and down-converts the amplified RF signal into an intermediate frequency (IF) signal (whose frequency is lower than the RF signal). The second amplification stage performs an intermediate frequency amplification on the IF signal, and then allocates a larger portion of gain of the UIF demodulation circuit to the second amplification stage to avoid the trade-off between the high frequency gain and the power consumption. However, under a requirement of lowering the power consumption of the overall receiver for the UIF demodulation circuit with the conventional UIF demodulator topology, the gain of the high-frequency amplification circuit is simultaneously lowered and this results in a lower noise figure and finally lowers the overall system sensitivity.

Therefore, there are main issues for the industry to research how to enhance receiving sensitivity of the overall receiver system without additional power consumption for the receiver of the communication system adopting the OOK modulation, or how to maintain the same system sensitivity with a lower overall power consumption.

SUMMARY

The disclosure provides an exemplary embodiment of a radio frequency (RF) front-end circuit. According to the exemplary embodiment, the RF front-end circuit includes a first linear amplifier, a second linear amplifier, and calibration unit. The first linear amplifier is configured to receive a RF signal through an antenna. The first linear amplifier performs a high-frequency amplification on the RF signal to generate an amplified RF signal and then down-converts the amplified RF signal into an intermediate frequency (IF) signal. The second linear amplifier is coupled to the first linear amplifier and is configured to receive the IF signal. The second linear amplifier then performs a low-frequency amplification on the IF signal to generate an amplified IF signal. The calibration unit is coupled to the first linear amplifier and the second linear amplifier, which is configured to receive a voltage gain value fed back from the second linear amplifier. According to the voltage gain value, the calibration unit performs an automatic calibration procedure according to the voltage gain fed back from the second linear amplifier to search for a current value of an input current of the first linear amplifier, where the current value corresponds to the maximum voltage gain of the first linear amplifier.

The disclosure provides an exemplary embodiment of an operation method of a RF front-end circuit. According to the exemplary embodiment, the operation method of a RF front-end circuit includes following steps: receiving a RF signal; performing a high frequency amplification on the RF signal through the first linear amplifier to generate the amplified RF signal and down-converts the amplified RF signal into the IF signal, where the first linear amplifier includes a low noise amplifier and a mixer; performing a low frequency amplification on the IF signal to generate an amplified IF signal through the second linear amplifier; and executing the automatic calibration procedure based on the voltage gain fed back from the second linear amplifier to search for the corresponding current value of an input current of the first linear amplifier, where the current value corresponds to the input current which maximizes the voltage gain of the first linear amplifier.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
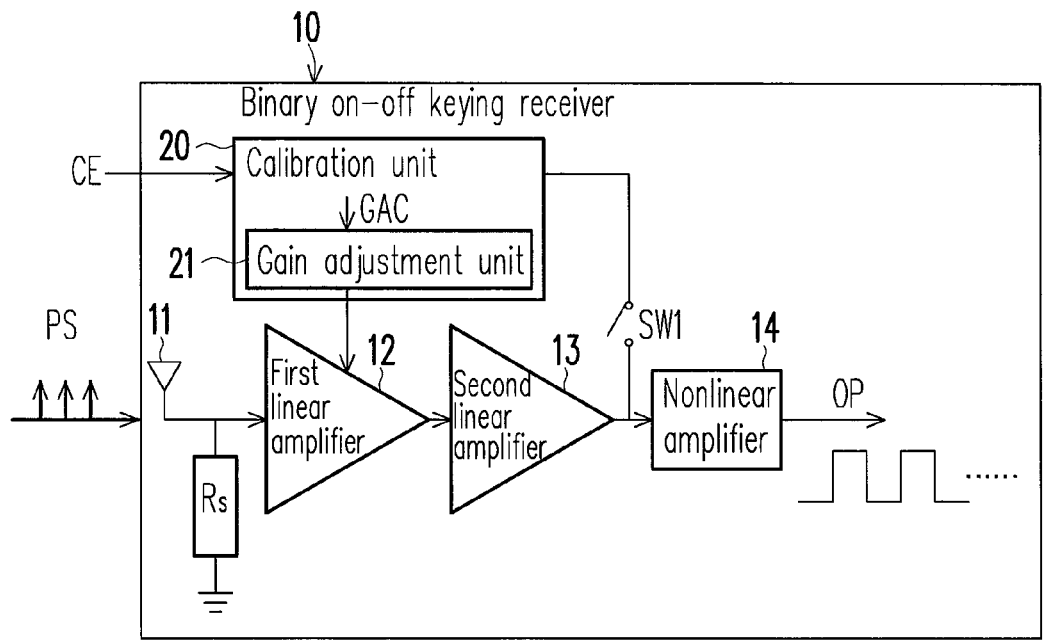
FIG. 1 is a functional block diagram of an on-off keying (OOK) receiver according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The disclosure provides a radio frequency (RF) front-end circuit of an on-off keying demodulator (hereafter referred to as an OOK receiver) and an operation method (including an auto-calibration method) of the RF front-end circuit. The OOK receiver may be adapted to a wireless sensor network (WSN) or the RF front-end circuit of a wake-up receiver. The OOK receiver mainly applies a push-pull current reuse technique with a foreground calibration circuit topology. Furthermore, when a RF signal of a transmitting device is used for executing a calibration procedure at a receiving device, the OOK receiver may search for a current value of an input current of a linear amplifier whose voltage gain is optimized/maximized through a calibration unit of the OOK receiver and its gain adjustment unit by the preset communication protocol between the receiving device and the transmitting device. As a result, the OOK receiver could achieve enhancing the receiving sensitivity of the overall system without additional power consumption, or maintains the same system sensitivity with lower overall power consumption. Throughout the disclosure, the receiving device may be referred to as a receiver system as well.

FIG. 1 is a functional block diagram of an on-off keying (OOK) receiver according to an exemplary embodiment. Referring to FIG. 1, the RF front-end circuit of the OOK receiver 10 includes a first linear amplifier 12, a second linear amplifier 13, a nonlinear amplifier 14, a calibration unit 20, a switch SW1, and detection resistor Rs. Basically, the OOK receiver 10 adopts a UIF demodulator circuit topology.

An input terminal of the first linear amplifier 12 is coupled to an antenna 11 and is grounded by the detection resistor Rs. An output terminal of the first linear amplifier 12 is coupled to the second linear amplifier 13. The first linear amplifier 12 receives the RF signal (i.e., a pilot signal (PS) or a reference signal). The first linear amplifier 12 (which has gain $G_1$) performs a high-frequency amplification on the RF signal to generate an amplified RF signal, down-converts the amplified RF signal into an intermediate frequency (IF) signal (not shown in FIG. 1), and then outputs the IF signal to the second linear amplifier 13 (which has gain $G_2$). An input terminal of the second linear amplifier 13 is coupled to the first linear amplifier 12, and is configured to receive the IF signal. The second linear amplifier 13 performs a low-frequency amplification on the IF signal to generate an amplified IF signal, and outputs the amplified IF signal to the nonlinear amplifier 14 (which has gain $G_{nonlinear}$). The nonlinear amplifier 14 receives the amplified IF signal, and performs the envelope detector process on the amplified IF signal to obtain a data signal OP that was transmitted in the received RF signal. Then, the nonlinear amplifier 14 outputs the data signal OP to the subsequent logic circuits or analog circuits for further processing. The linear gain $G_{linear}$ of the OOK receiver 10 may be illustrated as below.

$$G_{FB} = G_{linear} = G_1 + G_2 \qquad \text{equation (1)}$$

An output terminal of the second linear amplifier 13 is coupled to the calibration unit 20 through the switch SW1. The switch SW1 is to be short-circuited or open-circuited under the control of a calibration enable signal CE provided by the receiver system where the OOK receiver 10 is located. When the RF signal transmission transmitted by the transmitting device is used to execute the calibration procedure for the receiving device, such as the pilot signal PS shown in the FIG. 1, the receiver system may transmit a calibration enable signal CE to feed back the voltage gain $G_{FB}$ of the second linear amplifier 13 to the calibration unit 20 through the switch SW1. The calibration unit 20 transmits a gain adjustment command GAC to the gain adjustment unit 21 to continuously select an optimum current input value of the first linear gain unit 12. Various exemplary embodiments of the first amplifier 12 will be introduced in accordance with FIG. 2 to FIG. 4.

Figure 2:
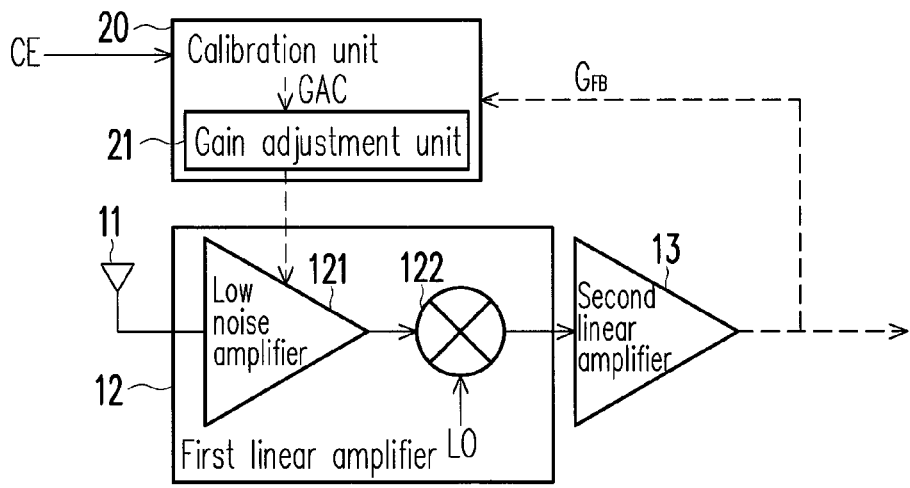
FIG. 2 is a functional block diagram of a first linear amplifier according to a first exemplary embodiment.

FIG. 2 is a functional block diagram of the first linear amplifier according to a first exemplary embodiment. Referring to FIG. 2, the first linear amplifier unit 12 includes a low noise amplifier (LNA) 121 and a mixer 122. An input terminal of the LNA 121 is coupled to the antenna 11, and the LNA 121 receives a control voltage bias or an input current from the gain adjustment unit 21. The high frequency amplification is performed by the LNA 121 on the RF signal received from the antenna 11 in response to the control voltage bias or the input current, and thus the gain of the LNA 121 corresponds to the control voltage bias or the input current provided by the gain adjustment unit 21. The control voltage bias and the input current provided by the gain adjustment unit 21 is controlled by the gain adjustment command signal GAC.

Referring to FIG. 2, the output terminal of the LNA 121 is coupled to a first input terminal of the mixer 122, the first input terminal of the mixer 122 receives the amplified RF signal, and a second input terminal of the mixer 122 receives a local oscillation signal LO. The local oscillation signal LO is provided by the receiver system in which the first linear amplifier 12 is disposed. For example, the first linear amplifier 12 could be disposed in the OOK receiver 10, and the OOK receiver includes a voltage control oscillator (VCO), which is configured to generate the local oscillation signal LO to the mixer 122.

The mixer 122 mixes the amplified RF signal with the local oscillation signal LO to generate the IF signal. An output terminal of the mixer 122 is coupled to the input terminal of the second linear amplifier 13. The mixer 122 outputs the IF signal to the second linear amplifier 13 to perform the following low-frequency amplification. After the low-frequency amplification is performed on the IF signal by the second linear amplifier 13, the voltage gain $G_{FB}$ may be fed back to the calibration unit 20 while the calibration unit 20 is receiving the calibration enable signal CE. The aforementioned calibration enable signal CE could be generated by a preset communication protocol processor, where the communication protocol processor is disposed in the OOK receiver in which the first linear amplifier 12, the second linear amplifier 13, and the calibration unit 20 are disposed. With the first linear amplifier 12 receiving the pilot signal PS transmitted by the transmitting device, the calibration unit 20 may perform the auto-calibration procedure and sends the gain adjustment command GAC to the gain adjustment unit 21 continuously. The current input value of the linear amplifier 12 is adjusted in order to search for a current value of the input current of the LNA 121, where the corresponding current value corresponds to the input current which maximizes the voltage gain of the first linear amplifier 12. The technical contents of the calibration unit 20 will be illustrated in detail in accordance with FIG. 6 to FIG. 11. The aforementioned auto-calibration procedure may be, for example, a linear search algorithm, a binary search algorithm, or any other algorithms that can be used to search for the corresponding value of input current which maximizes the voltage gain of the first linear amplifier 12.

Figure 3:
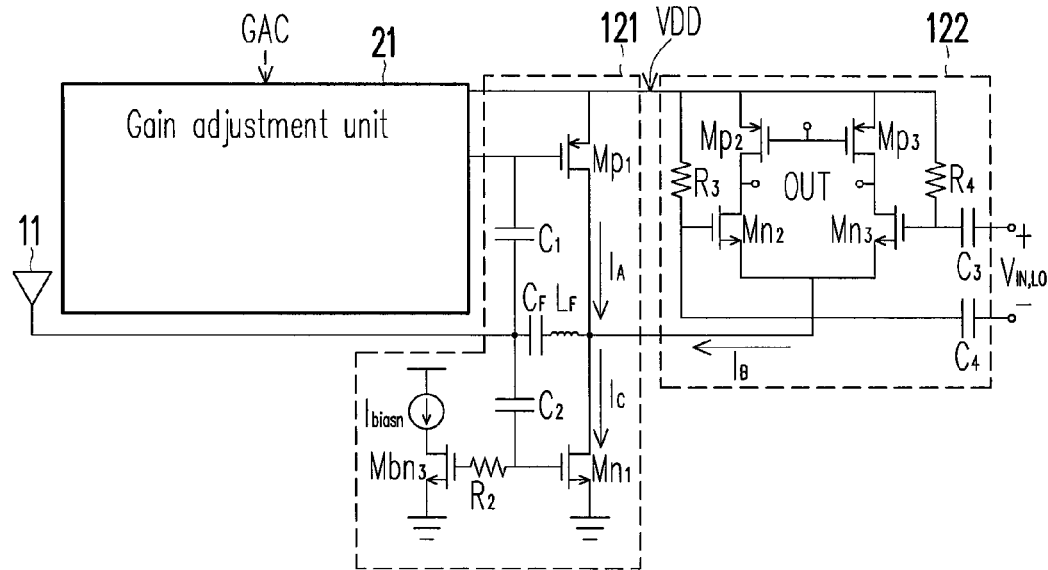
FIG. 3 is a functional block diagram of a first linear amplifier according to a second exemplary embodiment.

FIG. 3 is a functional block diagram of the first linear amplifier according to a second exemplary embodiment. Referring to FIG. 3, the first linear amplifier 12 includes a LNA 121 and a mixer 122. The input terminal of the LNA 121 is coupled to the antenna 11, and the LNA 121 is configured to receive the control voltage bias or the input current of the gain adjustment unit 21, the high-frequency amplification is then performed by the LNA 121 on the RF signal received by the antenna 11 in response to the control voltage bias or the input current, where the gain of the LNA 121 corresponds to the control voltage bias or the input current provided by the gain adjustment unit 21. The control voltage bias or the input current provided by the gain adjustment unit 21 are controlled by the gain adjustment command signal GAC.

The technical implementations of the LAN 121 are illustrated in detail as following. The LNA 121 is a LNA circuit with a push-pull topology; and it is mainly composed by a first P-type transistor $Mp_1$ and a first N-type transistor $Mn_1$. The LNA circuit of the push-pull topology may provide a high gain for the first linear amplifier 12. A controller terminal of the first P-type transistor $Mp_1$ is coupled to the output terminal of the gain adjustment unit 21 and a first terminal of the capacitor $C_1$, which is configured to receive the control voltage bias or the input current of the gain adjustment unit 21, and coupled to the antenna 11 through the first capacitor $C_1$. The first capacitor $C_1$ decouples the direct current (DC) component of the RF signal of the antenna 11, and supplies the alternate current (AC) component of the RF signal of the antenna 11 to the control terminal of the first P-type transistor $Mp_1$. A first terminal of the first P-type transistor $Mp_1$ is coupled to the system voltage $V_{DD}$, a second terminal of the first P-type transistor $Mp_1$ is coupled to a first terminal of a first N-type transistor $Mn_1$. In the present exemplary embodiment, a current $I_A$ that flows through the first P-type transistor $Mp_1$ and a current $I_B$ that flows through the mixer 122 converge at a common terminal and then sum up to a current $I_C$ that flows through the first N-type transistor $Mn_1$. Therefore, the current $I_C$ may be expressed by the following equation (2).

$$I_C = I_A + I_B \quad \text{Equation (2)}$$

A common terminal of the first P-type transistor $Mp_1$ and the first N-type transistor $Mn_1$ is coupled to a filter capacitor $C_F$ and a filter inductor $L_F$. The filer capacitor $C_F$ and the filter inductor $L_F$ are connected in series, and the filer capacitor $C_F$ and the filter inductor $L_F$ form a serial inductor-capacitor (LC) matching network that is coupled to the antenna 11, which is configured to achieve the matching impedance of 50 ohm ($\Omega$) between the antenna 11 and the common terminal (or the push-pull topology) of the first P-type transistor $Mp_1$ and the first N-type transistor $Mn_1$. The noise matching between the antenna 11 and the common terminal of the first P-type transistor $Mp_1$ and the first N-type transistor $Mn_1$ may also be realized by the matching impedance of 50$\Omega$ of the serial inductor-capacitor (LC) matching network. As a result, the high-frequency amplification of the LNA 121 could be enhanced and the noise figure of the LNA 121 could be decreased at the same time.

The first terminal of the first N-type transistor $Mn_1$ is coupled to the second terminal of the first P-type transistor $Mp_1$. The control terminal of the first N-type transistor $Mn_1$ is coupled to the first terminal of the second capacitor $C_2$, and coupled to the antenna through the second terminal of the capacitor $C_2$. A second capacitor $C_2$ decouples the DC component of the RF signal of the antenna 11, and supplies the AC components of the RF signal to the control terminal of the first N-type transistor $Mn_1$. The second terminal for the first N-type transistor $Mn_1$ is connected to the ground.

The first N-type transistor $Mn_1$ and a second N-type transistor $Mbn_3$ form a current mirror circuit topology (or may be referred to as a first current mirror). Also, the control terminal of the first N-type transistor $Mn_1$ is coupled to a control terminal of a second N-type transistor $Mbn_3$ through a first resistor $R_2$. A first terminal of the second N-type transistor $Mbn_3$ is coupled to a current source $I_{biasn}$, a second terminal of the second N-type transistor $Mbn_3$ is connected to the ground, and the current $I_c$ that flows through the first N-type transistor $Mn_1$ is configured to be a fixed value in the present exemplary embodiment. Based on the relationship of the aforementioned equation (2), the LNA 121 and the mixer 122 altogether have the current reuse circuit topology, so the overall power consumption of the first linear amplifier 12 could be saved. When the current $I_c$ is configured to be a fixed value, the overall power consumption is fixed. When the current $I_A$ increases (namely, the high-frequency amplication gain of the LNA 121 is increased), the current $I_B$ decreases corresponsively (namely, the power consumption is decreased for down-converting the amplified RF signal into the IF signal).

Referring to FIG. 3, the mixer 122 is a single input-differential output mixer (or may be referred to as a frequency mixer). The mixer 122 is mainly composed of a differential pair which may be referred to as switching pair. The output terminal of the LNA 121 is a common terminal of the first P-type transistor $Mp_1$ and the first N-type transistor $Mn_1$, and the output terminal of the LNA 121 is coupled to the common terminal of the differential pair. In detail, the differential pair of the mixer 122 may include a third N-type transistor $Mn_2$ and a fourth N-type transistor $Mn_3$. First terminals of the third transistor $Mn_2$ and the fourth transistor $Mn_3$ are coupled to the system voltage $V_{DD}$ through a second P-type transistor $Mp_2$ and a third P-type transistor $Mp_3$ respectively. Second terminals of the third N-type transistor $Mn_2$ and the fourth N-type transistor $Mn_3$ are coupled together and thus form a common terminal of the differential pair. In the present exemplary embodiment, the second P-type transistor $Mp_2$ and the third P-type transistor $Mp_3$ provide equivalent functionality as a tunable active resistor. The tunable active resistor is mainly used to compensate insufficient gain caused by the manufacturing process offset. In other embodiments, the second P-type transistor $Mp_2$ and the third transistor $Mp_3$ may be replaced by resistors.

The first input terminal and the second input terminal of the differential pair of the mixer 122 receive the local oscillation signal LO which is supplied by the receiver system in which the first amplifier 12 is disposed. After the mixer 122 mixes the local oscillation signal LO with the amplified RF signal received by the common terminal of the differential pair to generate the IF signal. In more detail, the control terminal of the third N-type transistor $Mn_2$ is a first differential input terminal of the differential pair, and the control terminal of the fourth N-type transistor $Mn_3$ is a second differential input terminal of the differential pair. The first differential input terminal and the second differential input terminal respectively receive the local oscillation signal LO $V_{IN, LO}$. Furthermore, the control terminals of the third N-type transistor $Mn_2$ and the fourth N-type transistor $Mn_3$ are coupled to the system voltage $V_{DD}$ through the second resistor $R_3$ and the third resistor $R_4$ respectively.

In the present exemplary embodiment, the differential pair of the mixer 122 has a first differential output terminal and a second differential output terminal, where the first differential output terminal is the first terminal of the third N-type transistor $Mn_2$ and the second differential output terminal is the first terminal of the fourth N-type transistor $Mn_3$. The mixer 122 down-converts the RF signal into the IF signal OUT, and outputs the IF signal OUT through the first differential output terminal and the second differential output terminal to the second linear amplifier 13 to perform the subsequent low-frequency amplification.

It is noted that, in the exemplary embodiment of the FIG. 3, the adjustment unit 21 may be, for example, a plurality of current mirrors, a plurality of variable resistors connected in parallel, or other components that are able to control voltage or control current.

Figure 4:
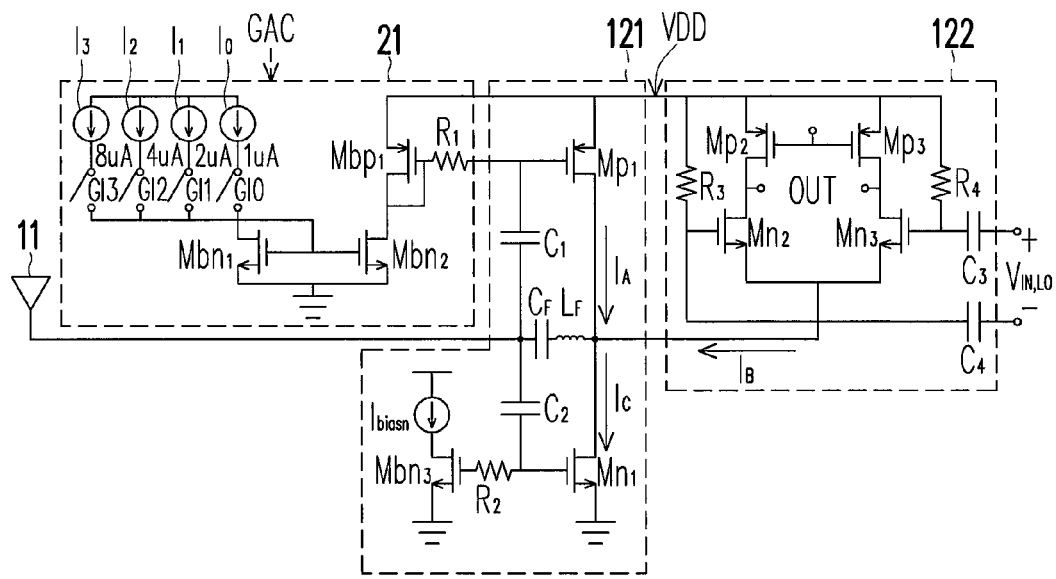
FIG. 4 is a functional block diagram of a first linear amplifier according to a third exemplary embodiment.

FIG. 4 is a functional block diagram of the first linear amplifier according to a third exemplary embodiment. Referring to FIG. 4, the first linear amplifier 12 includes a LNA 121 and a mixer 122. The circuit topology of the LNA 121 and mixer 122 in the FIG. 4 are similar to the exemplary embodiment in the FIG. 3; therefore, the related technical descriptions thereof may be referred to FIG. 3, and will not be repeated here. FIG. 4 provides an exemplary embodiment of the gain adjustment unit 21.

Referring to FIG. 4, the gain adjustment unit 21 may include a plurality of programmable power sources connected in parallel, for example, a programmable power source $I_0$, a programmable power source $I_1$, a programmable power source $I_2$ and a programmable power source $I_3$. In the present exemplary embodiment, when the system voltage $V_{DD}$ is 0.5V, the programmable power sources $I_0$, $I_1$, $I_2$, and $I_3$ are respectively provided with, for example, a current of 1 micro Amp (μA), 2 μA, 4 μA, and 8 μA, and respectively connected to a plurality of switches GI0, GI1, GI2, and GI3. The switches GI0, GI1, GI2, and GI3 are controlled by the gain adjustment command signal GAC provided by the calibration unit 20. The gain adjustment command signal GAC determines the switches GI0, GI1, GI2, and GI3 to be switched on or switched off, and it can be one of the switches switched on or switched off, or some of the switches being switched on or switched off simultaneously. The gain adjustment command signal GAC may include a 4-bit output signal which respectively switching on and/or switching off of the switches GI0, GI1, GI2, and GI3, and thus generates preset current values of the programmable current sources $I_0$, $I_1$, $I_2$, and $I_3$. In other exemplary embodiments, the number of the programmable current sources connected in parallel for the gain adjustment unit 21 can be other than four; however, output current value of each stage of the programmable current sources is double of the programmable current source of a previous stage. For example, the output current value of the $K+1^{th}$ programmable current source $I_{K+1}$ is double of the output current value of the $K^{th}$ programmable current source, where $K \geq 0$. However, the exemplary embodiments of the disclosure are not limited to the aforementioned descriptions, the preset current values generated by the programmable power source $I_0$, $I_1$, $I_2$, and $I_3$ are not limited to the binary proportion topology. Accordingly, a plurality of programmable current sources connected in parallel may generate preset current values through the output signal of the gain adjustment command GAC.

Referring to the FIG. 4, a plurality of programmable current sources connected in parallel of the gain adjustment unit 21 are coupled to a current mirror which is composed of a fifth N-type transistor $Mbn_1$ and a sixth N-type transistor $Mbn_2$. In the present exemplary embodiment, the control terminals of the fifth N-type transistor $Mbn_1$ and the sixth N-type transistor $Mbn_2$ are coupled to the programmable current sources connected in parallel, a first terminal of the fifth N-type transistor $Mbn_1$ is also coupled to the current sources connected in parallel. A first terminal of the sixth N-type transistor $Mbn_2$ is coupled to another current minor, and the second terminals of the fifth N-type transistor $Mbn_1$ and the sixth N-type transistor $Mbn_2$ are both connected to the ground.

The first terminal of the sixth N-type transistor $Mbn_2$ is coupled to the current mirror which may be composed by the first P-type transistor $Mp_1$ and the fourth P-type transistor $Mbp_1$. Through this current mirror and another current mirror which is composed of the fifth N-type transistor $Mbn_1$ and the sixth N-type transistor $Mbn_2$, the current $I_A$ flowing through the first P-type transistor $Mp_1$ is controlled by the overall output current values of a plurality of programmable current sources in parallel connection (at this point, may be referred to as adjustable current $I_P$). Under the preset operation condition(s), the current value of the current $I_A$ may be equivalent to the current value of the adjustable current $I_P$.

A first terminal of the fourth P-type transistor $Mbp_1$ is coupled to the system voltage $V_{DD}$, a second terminal of the fourth P-type transistor $Mbp_1$ is coupled to a first terminal of the sixth N-type transistor $Mbn_2$, and a control terminal of the fourth P-type transistor $Mbp_1$ is coupled to a control terminal of the first P-type transistor $Mp_1$ through a fourth resistor $R_1$.

Figure 5:
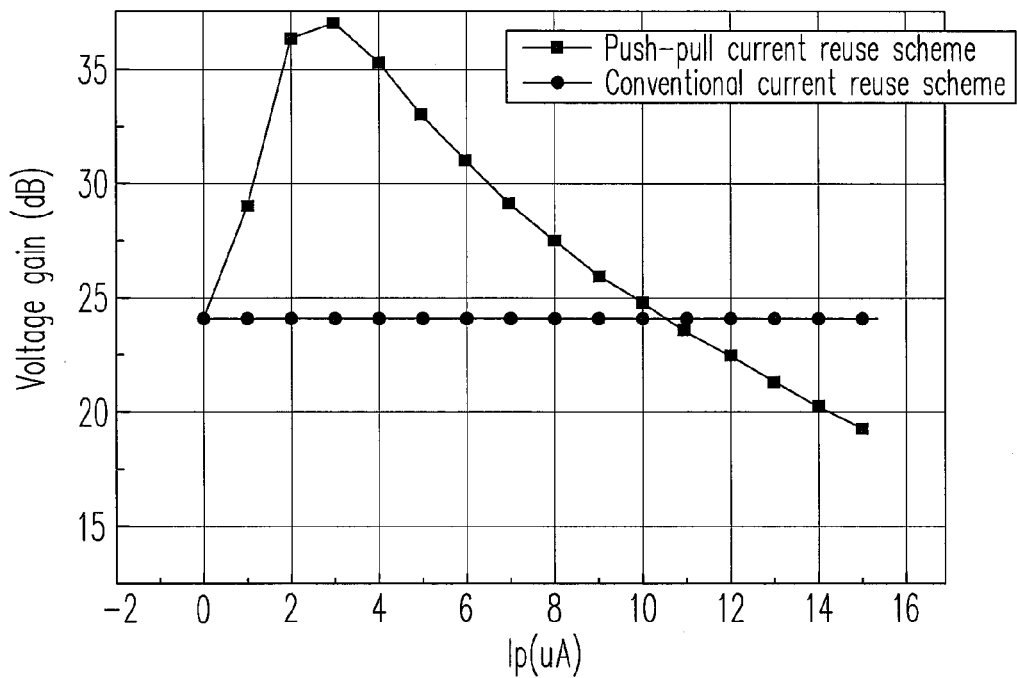
FIG. 5 is a schematic diagram illustrating the corresponding voltage gain of the first linear amplifier generated when the input current of the low noise amplifier is varied according to an exemplary embodiment.

FIG. 5 is a schematic diagram illustrating the corresponding voltage gain generated in the first linear amplifier when the input current of the low noise amplifier is varied according to an exemplary embodiment. In other words, FIG. 5 illustrates an effect of the adjustable current $I_P$ to the current $I_A$ of the LNA 121 in the first amplifier 12 if the current of the adjustable current $I_P$ increases; however, the current $I_C$ is still controlled by the current source $I_{biasn}$ and remains fixed. In FIG. 5, a vertical axis is the voltage gain (dB) of the first linear amplifier and a horizontal axis is the current value (μA) of the adjustable current $I_P$.

Through the practical experiments and observations, in the conventional current reuse circuit, the voltage gain remains at an average of 24 dB regardless of the value of the adjustable current $I_P$. However, in the exemplary embodiments of the disclosure, for example, the exemplary embodiments in the FIGS. 3 and 4, which use the push-pull current reuse circuit topology, have shown variations in the curve due to the voltage gain changes with different current values of the adjustable current $I_P$. For example, in this exemplary embodiment, the maximum voltage gain is approximately 36 dB through the experimental observation, and the corresponding adjustable current is 3 μA, if the received gain adjustment command signal GAC is "0011" for the switch GI3, GI2, GI1, and GI0 corresponding to the programmable current $I_3$, $I_2$, $I_1$, and $I_0$ shown in the FIG. 4. Further, the maximum voltage gain of this exemplary embodiment with the push-pull circuit topology improves about 12 dB in comparison with the average voltage gain of the conventional current reuse circuit.

Figure 6:
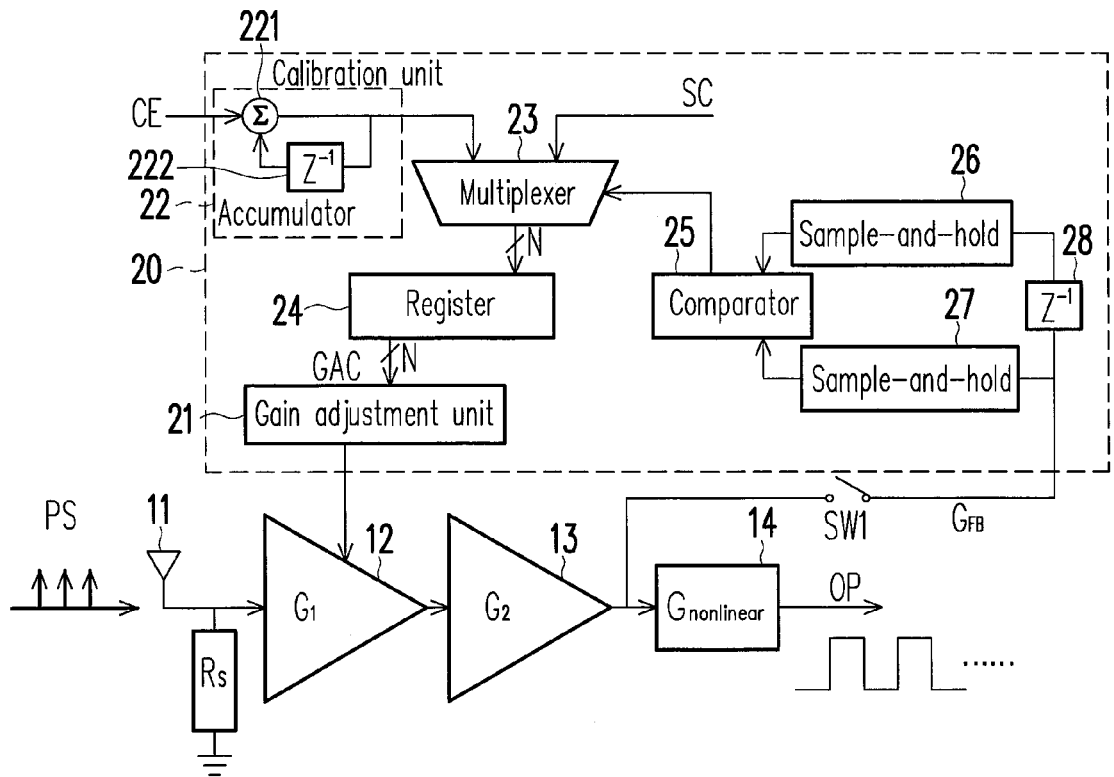
FIG. 6 is a functional block diagram of a calibration unit according to a fourth exemplary embodiment.

FIG. 6 is a functional block diagram of the calibration unit according to a fourth exemplary embodiment. Through the experimental measurements and observations, under a low operation voltage environment, if there is a manufacturing process variation or temperature variation, the gain adjustment unit 21 could form a close loop with the first linear amplifier 12 and the second linear amplifier 13. During the preset foreground calibration period, through the auto-calibration procedure, the adjustable current $I_P$ is gradually adjusted in order to search for or trace the current value of the current $I_A$ corresponding to the maximum voltage gain. During the normal operation period in which the received RF signal is used by the transmitting device to transmit the data signal, the gain adjustment unit 21, the first linear amplifier 12, and the second linear amplifier 13 are configured to from an open loop and no longer adjust the adjustable current $I_P$, but rather uses a fixed current $I_A$ for the first linear amplifier 12, where the fixed current $I_A$ is corresponding to the input current which corresponds to the optimum/maximum voltage gain. The current variation range of the adjustable current $I_P$ is not wide, and an adjustable clock pulse of the gain adjustment unit 21 is equivalent to a transmission clock pulse of the pilot signal PS (which is only used to calibrate the current IA).

Referring to FIG. 6, the antenna 11, the coupling relationships of the first linear amplifier 12, the second linear amplifier 13, a nonlinear amplifier 14, a calibration unit 20, a switch SW1, and the detector resistor Rs are similar to the exemplary embodiment in the FIG. 1, therefore, the related description of the OOK receiver 10 may be referred to the related technical contents of FIG. 1.

The output terminal of the second linear amplifier 13 is coupled to the calibration unit 20 through the switch SW1, and the switch SW1 is controlled by the calibration enable signal CE received from the calibration unit 20 simultaneously. That is, the switch SW1 is configured to be open-circuited or short-circuited according to the calibration enable signal CE from the calibration unit 20. When the RF signal transmission transmitted by the transmitting device is only used to perform the calibration of the receiving device (or the receiver system), such as the pilot signal shown in the FIG. 6, the receiver system sends a calibration enable signal CE to feedback the voltage gain $G_{FB}$ of the second linear amplifier 13 to the calibration unit 20 through the switch SW1. The calibration unit 20 selects an optimum current value of the input current of the first linear amplifier 12 through continuously sending the gain adjustment command signal GAC to the gain adjustment unit 21, adjusting the adjustable current $I_P$ and then comparing the resultant voltage gains $G_{FB}$ before and after the adjustment of the adjustable current $I_P$.

The implementations of the calibration unit 20 are illustrated more clearly as following. The calibration unit 20 may include a gain adjustment unit 21, an accumulator 22, a multiplexer 23, a register 24, a comparator 25, a sample-and-hold unit 26, a sample-and-hold unit 27, and a delay unit 28. In the present exemplary embodiment, the gain adjustment unit 21 may be the gain adjustment unit 21 shown in the FIG. 4.

Referring to the FIG. 6, the accumulator 22 may include a summation unit 221 and a delay unit 222. The delay unit time of the delay unit 222 and the delay unit 28 corresponds to the operation clock pulse of the calibration 20. A first receiving terminal of the summation 221 is configured to receive the calibration enable signal CE. A second receiving terminal of the sum 221 is coupled to the delay unit 222. The delay unit 222 is configured to provide a positive feedback delayed by a delay unit time. An output of the sum 221 is coupled to the multiplexer 23. The multiplexer 23 receives the summation result of the summation unit 221 and a stop command signal SC, where the stop command signal SC may be provided by the comparator 25. The multiplexer 23 outputs N bits of the digital data to the register 24, and the register 24 outputs N bits of the digital data to the gain adjustment unit 21 as the gain adjustment command signal GAC.

At the feedback path coupled to the switch SW1, a receiving terminal of the sample-and-hold unit 27 is coupled to the switch SW1 and a receiving terminal of the sample-and-hold unit 26 is coupled to the switch SW1 through the delay unit 28. The sample-and-hold unit 27 is configured to sample the voltage gain $G_{FB}$ that is fed back to the calibration unit 20 through the switch SW1. The sample-and-hold 26 is configured to sample the voltage gain $G_{FB}$ with a delay in a delay unit time. The outputs of the sample-and-hold unit 26 and the sample-and-hold unit 27 are coupled to the comparator 25, and the comparator 25 generates the stop command signal SC and sends the stop command signal SC to the multiplexer according to two voltage gains $G_{FB}$ which are respectively sampled by the sample-and-hold 26 unit and the sample-and-hold unit 27. To be illustrated more clearly, the comparator 25 generates a comparison value which is a sampling i+1 (sampled by the sample-and-hold unit 26) minus a sampling i (sampled by the sample-and-hold unit 27). If the comparison value is less than 0, then the comparator 25 generates the stop command signal SC, and then sends the stop command signal SC to the multiplexer 23 to stop the adjustment process on the adjustable current $I_P$.

Figure 7:
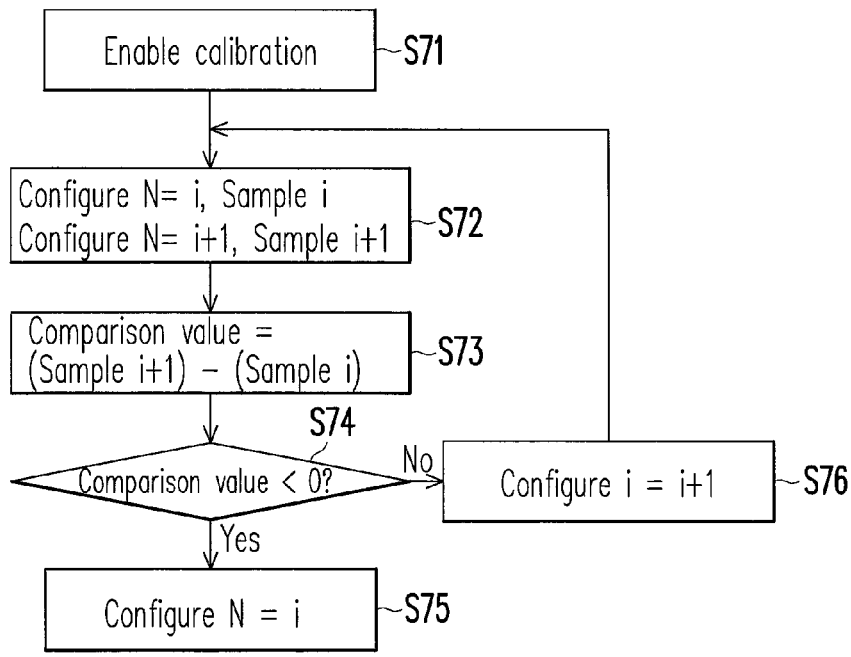
FIG. 7 is a flow chart illustrating a calibration method according to a fourth embodiment.

FIG. 7 is a flow chart illustrating the calibration method according to a fourth exemplary embodiment. FIG. 7 may be adapted to the process flow of the linear search algorithm of the calibration unit 20 in the FIG. 6. Referring to the FIG. 6 and FIG. 7, the calibration method of the linear search algorithm previously mentioned starts at step S71, and the calibration enable signal CE is received in the step S71. In step S72, the calibration unit 20 sets a parameter N to a variable i through the multiplexer 23 and register 24, and the sample-and-hold unit 26 samples the voltage gain $G_{FB}$ corresponding to the variable i. In the present exemplary embodiment, the parameter N is a value of the gain adjustment command signal GAC and the variable i is the present variable. In the step S72, the calibration unit 20 also sets the next parameter N to be (i+1), and simultaneously the sample-and-hold 26 unit samples the voltage gain $G_{FB}$ generated after the adjustment of the input current value corresponding to the variable (i+1).

In step S73, the calibration unit 20 obtains a difference between samplings before and after the adjustment which are the (sample i) and the (sample i+1). In step S74, the calibration unit 20 determines whether the comparison value is less than 0. According to observations on the curve in the FIG. 5, when the comparison value is less than 0, the voltage gain reaches the maximum value and continues to decrease progressively. When the comparison value is less than 0, step S75 is performed after the step S74; when the comparison value is greater than 0, step S76 is performed after the step S74.

In the step S75, the parameter N is reset to i and the outputted gain adjustment command signal GAC is i, since the calibration unit 20 has found the adjustable current $I_P$ that corresponds to the maximum voltage gain value. In the step S76, the calibration unit 20 confirms that the parameter N is set to (i+1) and the method continues to execute the step S72. The loop between the step S72, S73, S74, and S76 may continue until the comparison value which is the (sample i+1) minus (sample i) is less than 0.

Figure 8:
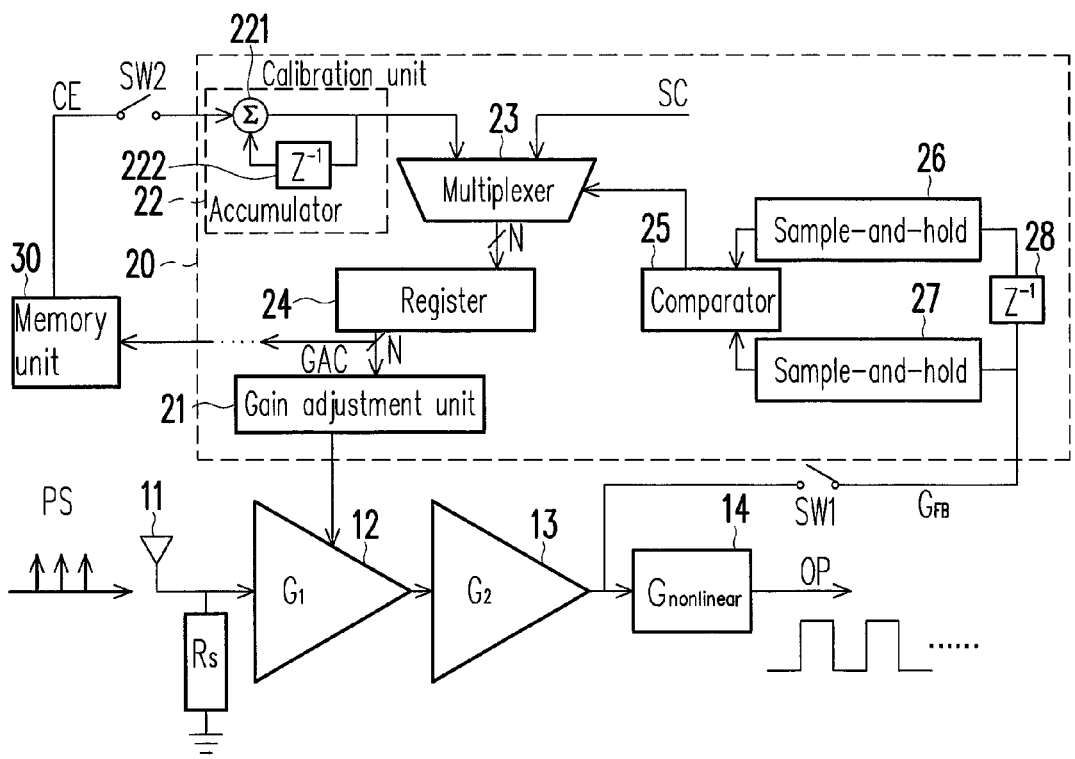
FIG. 8 is a functional block diagram of a calibration unit according to a fifth embodiment.

FIG. 8 is a functional block diagram of the calibration unit according to a fifth exemplary embodiment. The calibration unit 20 in the FIG. 8 is similar to the calibration unit 20 in the FIG. 6, the difference between them is that the calibration unit 20 in the FIG. 8 further includes a memory unit 30 such as a read only memory (ROM). The memory unit 30 is configured to store parameter value of the confirmed gain adjustment command signal GAC of the last calibration period. The calibration unit 20 may select the confirmed gain adjustment command signal GAC of the previous calibration period prior to the next calibration period to set the parameter N to i. An input terminal of the memory unit 30 is coupled to the output of the register 24, which is configured to receive N-bits of parameter values. An output terminal of the memory unit 30 is coupled to a first input terminal of the accumulator 221 through a switch SW2. The switch SW1 and the switch SW2 are controlled by the calibration unit 20 and configured to be short-circuited or open-circuited by the calibration enable signal CE received simultaneously. When the RF signal transmission transmitted by the transmitting device is only configured to perform the calibration of the receiving device, such as the pilot signal shown in the FIG. 8, the receiver system sends a calibration enable signal CE to feedback the voltage gain $G_{FB}$ of the second linear amplifier 13 to the calibration unit 20 through the switch SW1. The parameter value in N bits stored in the memory unit 30 is provided to the summation unit 221.

Figure 9:
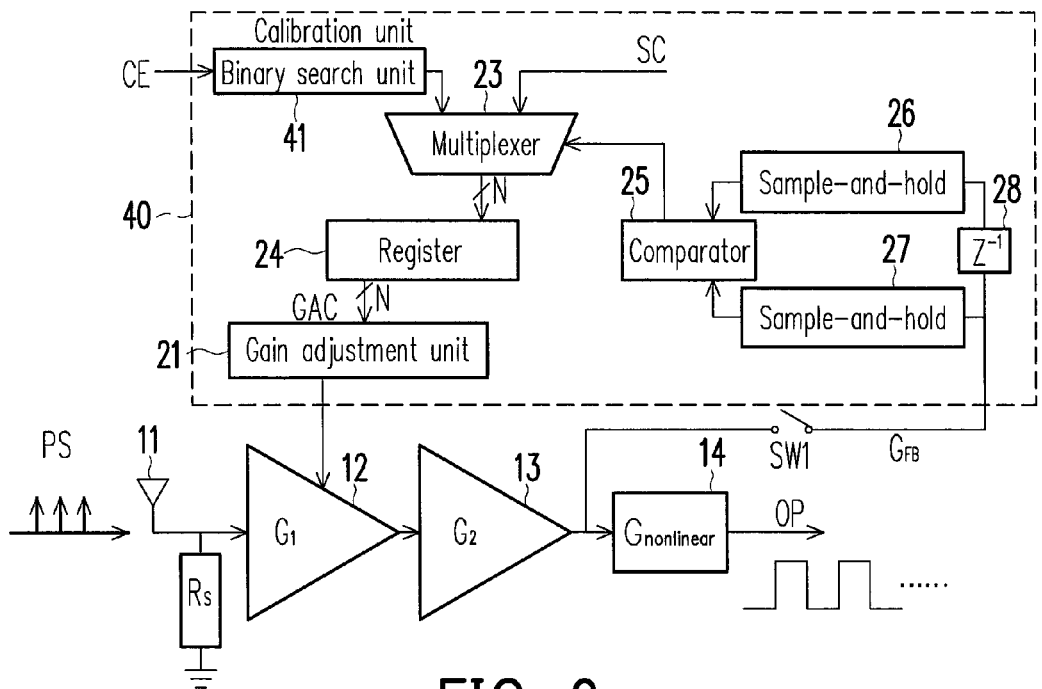
FIG. 9 is a functional block diagram of a calibration unit according to a sixth embodiment.

FIG. 9 is a functional block diagram of the calibration unit according to a sixth exemplary embodiment. The calibration unit 20 in FIG. 9 is similar to the calibration unit 20 in FIG. 6. However, the calibration unit 40 in FIG. 9 is adapted to implement a binary search calibration method, and the calibration unit 40 may include a binary search unit 41 to replace the functionality of the accumulator 22. The binary search unit 41 receives the calibration enable signal CE and outputs the binary search result to the multiplexer 23.

Figure 10:
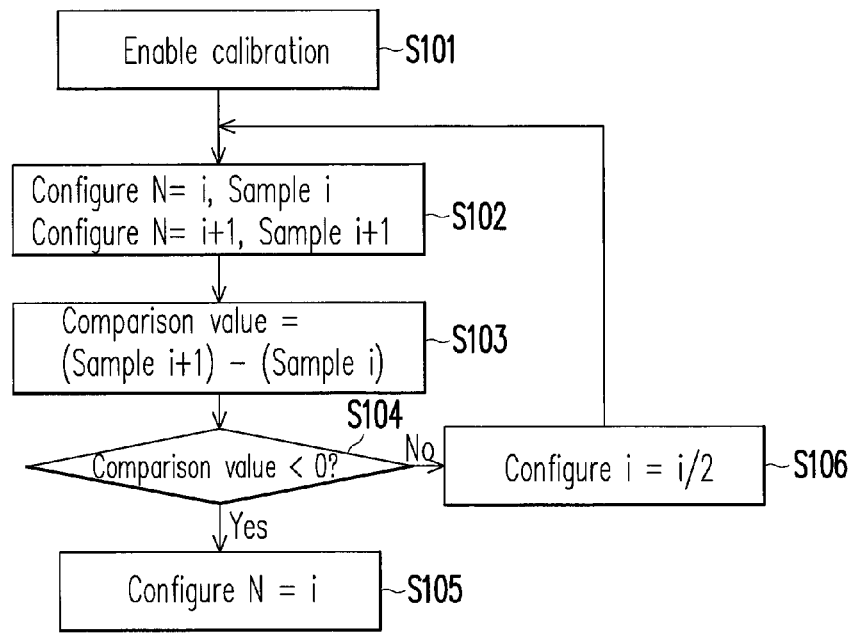
FIG. 10 is a flow chart of a calibration method according to a sixth embodiment.

FIG. 10 is a flow chart illustrating the calibration method according to a sixth exemplary embodiment. The flow chart shown in FIG. 10 may be adapted for the process flow of the binary search algorithm of the calibration unit 20 in the FIG. 9. Referring to the FIG. 9 and FIG. 10, a binary search algorithm calibration method starts at step S101. In the step S101, the calibration enable signal CE is received. In step S102, the calibration unit 20 sets a parameter N to i through the multiplexer 23 and the register 24, and the sample-and-hold unit 26 samples the voltage gain $G_{FB}$ corresponding to the variable i. In the present exemplary embodiment, the parameter N is the value of the gain adjustment command signal GAC, and the variable i is a present variable. In the step S102, the calibration unit 20 also sets the next parameter N to (i+1) simultaneously, and the sample-and-hold unit 27 then samples the voltage gain $G_{FB}$ generated after the adjustment of the input current value corresponding to the variable (i+1).

In step S103, the calibration 20 obtains the difference between the (sample i) and (sample i+1) which are the sampling results obtained respectively before and after adjustment of the input current value, and the calibration 20 generates a comparison value which is equal to that the (sample i+1) minus the (sample i) through the comparator 25. In step S104, the calibration unit 20 determines whether the comparison value is less than 0. When the comparison value is less than 0, step S105 is performed after the step S104. When the comparison value is greater than or equal to 0, step S106 is performed after the step S104.

In the step S105, the parameter N is reset by the calibration unit 20 to I, and the outputted gain adjustment command signal GAC is i, since the calibration unit 20 has found the adjustable current $I_P$ that corresponds to the maximum voltage gain of the first linear amplifier 12. In the step S106, the binary search unit 41 of the calibration unit 20 sets the present parameter to i=i/2, and then continues to execute the step S102. The loop between the step S102, S103, S104, and S106 may continue until the comparison value which is the (sample i+1) minus the (sample i) is less than 0.

Figure 11:
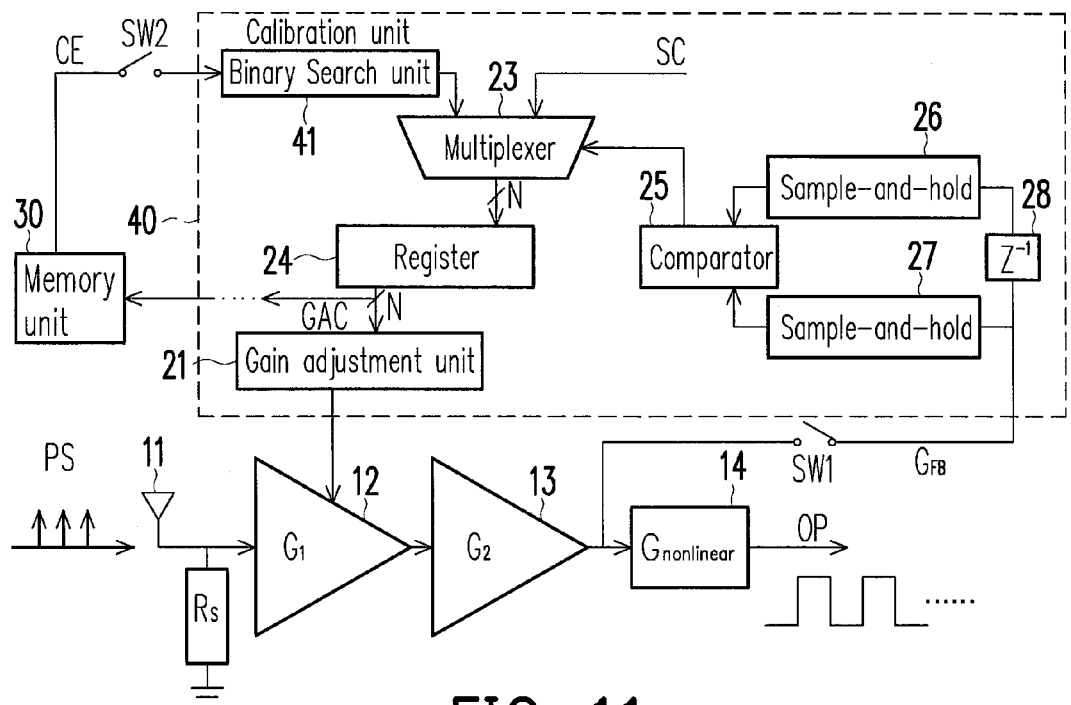
FIG. 11 is a functional block diagram of a calibration unit according to a seventh embodiment.

FIG. 11 is a functional block diagram of the calibration unit according to a seventh exemplary embodiment. The calibration unit 40 in FIG. 11 is similar to the calibration unit 20 in FIG. 9. The difference between them is that the calibration unit 40 in FIG. 11 further includes a memory unit 30 such as a ROM. The memory unit 30 is configured to store parameter value of the confirmed gain adjustment command signal GAC of the last calibration period. The calibration unit 20 may select the confirmed gain adjustment command signal GAC of the previous calibration period prior to the next calibration period to set the parameter N to i. The input terminal of the memory unit 30 is coupled to the output terminal of the register 24, which is configured to receive N-bits of parameter value. The output terminal of the memory unit 30 is coupled to the first input of the accumulator 221 through the switch SW2. The switch SW1 and the switch SW2 are controlled by the calibration unit 20, and configured to be short-circuited or open-circuited by the calibration enable signal CE received simultaneously. When the RF signal transmission transmitted by the transmitting device is only used to perform the calibration of the receiving device such as the pilot signal shown in the FIG. 11, the receiver system sends a calibration enable signal CE to feedback the voltage gain $G_{FB}$ of the second linear amplifier 13 to the calibration unit 20 through the switch SW1. The parameter value in N bits stored in the memory unit 30 is provided to the binary search unit 41.

Figure 12:
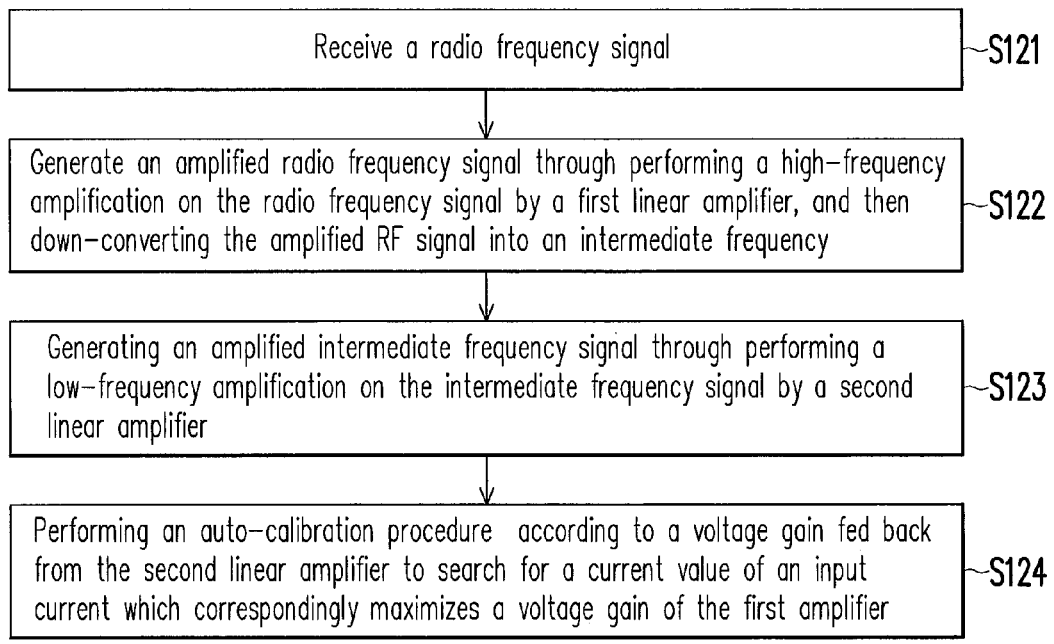
FIG. 12 is an operation method of a RF front-end circuit according to an exemplary embodiment.

FIG. 12 is an operation method of a RF front-end circuit according to an exemplary embodiment. The operation method of a RF front-end circuit of this exemplary embodiment may be adapted to the OOK receiver of any one of the exemplary embodiments from FIG. 1 to FIG. 4. Referring to FIG. 12, the operation method of a RF front-end circuit may include the following steps. In step S121, a RF signal is received. In step S122, an amplified RF signal is generated through a high-frequency amplification performed on the RF signal by a first linear amplifier, and the amplified RF signal is down-converted into an intermediate frequency. In the present exemplary embodiment, the first linear amplifier includes a LNA and a mixer. The LNA has the push-pull circuit topology, and the LNA and the mixer altogether have the current reuse topology. In step S123, an amplified IF signal is generated through the low-frequency amplification performed on the IF signal by a second linear amplifier. In step S124, an auto-calibration procedure is executed according to a voltage gain fed back from the second linear amplifier to search for the current value corresponding to the input current which maximizes the voltage gain of the first linear amplifier.

In other exemplary embodiment, the aforementioned operation method of a RF front-end circuit may also include obtaining the data signal from the RF signal through an envelope detection performed on the amplified IF signal by a nonlinear amplifier.

In other exemplary embodiments, the aforementioned auto-calibration procedure may include following procedures. The pilot signal of a receiving terminal device is received by the first linear amplifier. The current value of an input current of LNA is continuously adjusted until the current value to the input current which maximizes the voltage gain of the first linear amplifier is found.

In other exemplary embodiment, the aforementioned operation method of a RF front-end circuit may also include configuring the first current which flows through P-type transistors of the low noise amplifier that has the push-pull circuit topology and the second current which flows through the mixer to sum up to a third current which flows through a N-type transistor of the push-pull circuit topology, and controlling the current value of the third current to be a fixed value by a current source and a current mirror.

In other exemplary embodiment, the aforementioned auto-calibration procedure may include utilizing a linear search algorithm to adjust the current value of the input current of the first linear amplifier continuously until the current value corresponding to the input value which maximizes the voltage gain of the first linear amplifier is found.

In other exemplary embodiment, the aforementioned auto-calibration procedure includes utilizing a binary search algorithm to adjust the current value of the input current of the first linear amplifier continuously until the current value corresponding to the input value which maximizes the voltage gain of the first amplifier is found.

When the auto-calibration procedure uses the linear search algorithm, the auto-calibration procedure may include the following steps. The current value of the input current is set to a parameter i, and a first voltage gain which corresponds to the input current is sampled, where the parameter i is greater than or equal to 0. Then, the current value of the input current is set to the parameter i plus a preset unit (i.e. 1 μA), and a second voltage gain which corresponds to the latest configured input current is sampled. Then the auto-calibration procedure continues to determine whether the difference between the second voltage gain and the first voltage gain (which equals to the second voltage gain minus the first voltage gain) is less than zero. If the difference is less than zero, the corresponding current value is determined to be the parameter i. If the difference is greater than zero, the parameter i is set to be the parameter i plus the preset unit, and the three aforementioned steps are repeated.

In summary, according to the exemplary embodiments, an on-off key receiver and an operation method thereof are provided. The OOK receiver utilizes the push-pull circuit topology with the current reuse circuit topology. Also, through a foreground auto-calibration procedure adopted by the OOK receiver, the input current value which corresponds to the optimum voltage gain of the first linear amplifier can be found quickly through receiving the pilot signal transmitted by the transmitting device. With the current reuse technology, when the current demand of the high-frequency amplification increases, the overall system current could remain fixed. Therefore, it may achieve improving the receiving sensitivity of the overall system without increasing additional power consumption.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A radio frequency front-end circuit, comprising:
   a first linear amplifier, configured to receive a radio frequency signal, perform a high-frequency amplification on the radio frequency signal to generate an amplified radio frequency signal, and down-convert the amplified radio frequency signal into an intermediate frequency signal;
   a second linear amplifier, coupled to the first linear amplifier, configured to receive the intermediate frequency signal, and perform a low-frequency amplification on the intermediate frequency signal to generate an amplified intermediate frequency signal; and
   a calibration unit, coupled to the first linear amplifier and the second linear amplifier, configured to receive a voltage gain fed back from the second linear amplifier, and execute an auto-calibration procedure according to the voltage gain fed back from the second linear amplifier to search for a current value of an input current of the first linear amplifier, where the current value corresponds to a maximum voltage gain of the first linear amplifier.

2. The radio frequency front-end circuit of claim 1, further comprising:
   a nonlinear amplifier, coupled to the second linear amplifier, configured to receive the amplified intermediate frequency signal, perform an envelope detection on the amplified intermediate frequency signal to obtain data signal in the radio frequency signal.

3. The radio frequency front-end circuit of claim 1, wherein the calibration unit comprises:
   a gain adjustment unit, coupled to the first linear amplifier, configured to supply a gain adjustment command signal to control the gain adjustment unit to generate the input current to the first linear amplifier.

4. The radio frequency front-end circuit of claim 3, wherein:
   when the calibration unit executes the auto-calibration procedure, the first linear amplifier receives a pilot signal from a transmitting device, and, during the auto-calibration procedure, the calibration unit continuously controls the current value of the input current generated by the gain adjustment unit until a corresponding current value, of the input current of the first linear amplifier, which maximizes the voltage gain of the first linear amplifier is found.

5. The radio frequency front-end circuit of claim 4, wherein:
   the auto-calibration procedure is a linear search algorithm, wherein the calibration unit utilizes the linear search algorithm to continuously adjust the current value of the input current until the corresponding current value of the input current, of the first linear amplifier, which maximizes the voltage gain of the first linear amplifier is found.

6. The radio frequency front-end circuit of claim 4, wherein:
   the auto-calibration procedure is a binary search algorithm, wherein the calibration unit utilizes the binary search algorithm to continuously adjust the current value of the input current of the first linear amplifier, until the corresponding current value which maximizes the voltage gain of the first linear amplifier is found.

7. The radio frequency front-end circuit of claim 3, wherein the first linear amplifier comprises:
   a low noise amplifier, coupled to an antenna and the gain adjustment unit, configured to receive the radio frequency signal and the input current, and perform the high-frequency amplification on the radio frequency signal to generate the amplified radio frequency signal; and
   a mixer, coupled to the low noise amplifier, configured to receive a local oscillation signal and the amplified radio frequency signal provided by the radio frequency front-end circuit, and then down-convert the amplified radio frequency signal into the intermediate frequency signal through mixing the local oscillation signal and the amplified radio frequency signal,
   wherein, the low noise amplifier has a push-pull circuit topology, and the low noise amplifier and the mixer altogether have a current reuse circuit topology.

8. The radio frequency front-end circuit of claim 7, the low noise amplifier comprises:
   a first P-type transistor, a first terminal of the first P-type transistor is coupled to a system voltage, a control terminal of the first P-type transistor is controlled by the gain adjustment unit, and a first current that flow through the first P-type transistor is the input current, and the control terminal of the first P-type transistor is further coupled to the antenna through a first capacitor; and a first N-type transistor, a first terminal of the first N-type transistor is coupled to a second terminal of the first P-type transistor, a second terminal of the first N-type transistor is connected to the ground, a control terminal of the first N-type transistor is coupled to the antenna through a second capacitor, and the first terminal of the first N-type transistor is coupled to the antenna through a LC matching network in series connection.

9. The radio frequency front-end circuit of claim 8, wherein:

the first N-type transistor and a second N-type transistor forms a first current mirror, a second current that flows through the mixer and the first current sums up to a third current that flows through the first N-type transistor, and the third current is controlled by a first current source which is coupled to the second N-type transistor.

10. The radio frequency front-end circuit of claim 8, wherein the mixer comprises:

a differential pair, coupled to the system voltage, a common terminal of the differential pair is coupled to the first terminal of the first N-type transistor, the first input terminal and a second input terminal of the differential pair receives the local oscillation signal, and a intermediate signal is generated after the differential pair mixes the amplified radio frequency signal with the local oscillation signal.

11. The radio frequency front-end circuit of claim 8, wherein the gain adjustment unit comprises:

a plurality of programmable current sources which are connected together in parallel, and a programmable current sources are configured to generate an input power according to the gain adjustment command signal; and a second P-type transistor, configured to form a second current mirror with the first P-type transistor, the second P-type transistor is coupled to the programmable current sources which are connected together in parallel, and the first current that flows through the first P-type transistor is controlled by the programmable current sources which are connected together in parallel.

12. The radio frequency front-end circuit of claim 8, wherein the gain adjustment unit comprises:

a plurality of variable resistors which are connected together in parallel, coupled to another system voltage, configured to generate an input power according to the gain adjustment command signal; and a second P-type transistor, configured to form a second current mirror with the first P-type transistor, the second P-type transistor is coupled to a variable resistors which are connected together in parallel, and the first current that flows through the first P-type transistor is controlled by a programmable current sources which are connected together in parallel.

13. An operation method of a radio frequency front-end circuit, comprising:

receiving a radio frequency signal;

generating an amplified radio frequency signal through performing a high-frequency amplification on the radio frequency signal by a first linear amplifier, and down-converting the amplified radio frequency signal into an intermediate frequency signal, wherein the first linear amplifier comprises a low noise amplifier and a mixer;

generating an amplified intermediate frequency signal through performing a low-frequency amplification on the intermediate frequency signal by a second linear amplifier; and executing an auto-calibration procedure according to a voltage gain fed back from the second linear amplifier to search for a current value of an input current of the first linear amplifier, where the current value corresponds to the input current which maximizes the voltage gain of the first linear amplifier.

14. The method of claim 13, further comprising:

performing an envelope detection on the amplified intermediate frequency signal through a nonlinear amplifier to obtain data signal in the radio frequency signal.

15. The method of claim 13, wherein the low noise amplifier has a push-pull circuit topology, and the low noise amplifier and the mixer altogether have a current reuse topology.

16. The method of claim 15, wherein the auto-calibration procedure comprises:

the first linear amplifier receiving a pilot signal from a transmitting device, and continuously adjusting the current value of the input current of the low noise amplifier until a corresponding current value which maximizes the voltage gain of the first linear amplifier is found.

17. The method of claim 15, further comprising:

configuring a first current which flows through P-type transistors of the low noise amplifier that has the push-pull circuit topology and a second current which flows through the mixer to sum up to a third current which flows through N-type transistors of the push-pull circuit topology; and controlling the current value of the third current to a fixed value by a current source and a current mirror.

18. The method of claim 15, wherein the auto-calibration procedure comprises:

utilizing a linear search algorithm to adjust the current value of the input current of the low noise amplifier continuously until the corresponding current value which maximizes the voltage gain of the first linear amplifier is found.

19. The method of claim 18, wherein the auto-calibration procedure comprises the following steps:

setting the current value of the input current to a parameter i, sampling a first voltage gain which corresponds to the input current, wherein the parameter i is greater than and equal to zero;

setting the current value of the input current to the parameter i plus a preset unit, and sampling a second voltage gain which corresponds to the input current; and when a difference where the second voltage gain minus the first voltage gain is less than zero, determining the corresponding current value to be the parameter i.

20. The method of claim 19, wherein the auto-calibration procedure further comprises the following steps:

when the difference where the second voltage gain minus the first voltage gain is greater than zero, setting the parameter i to the parameter i plus the preset unit, and repeat executing the following steps:

setting the current value of the input current to the parameter i, sampling the first voltage gain which corresponds to the input current;

setting the current value of the input current to the parameter i pulse the preset unit, and sampling the second voltage gain which corresponds to the input current; and determining whether the difference where the second voltage gain minus the first voltage gain is less than zero.

21. The method of claim 15, wherein the auto-calibration procedure comprises:

utilizing a binary search algorithm to adjust the current value of the input current of the low noise amplifier continuously until the corresponding current value which maximizes the voltage gain of the first linear amplifier is found.

\* \* \* \* \*